United States Patent [19]

Milkovic

[11] E Re. 28,851

[45] Reissued June 8, 1976

[54] CURRENT TRANSFORMER WITH ACTIVE LOAD TERMINATION

[75] Inventor: Miran Milkovic, Scotia, N.Y.

[73] Assignee: General Electric Company, Schenectady, N.Y.

[22] Filed: Mar. 13, 1975

[21] Appl. No.: 558,094

Related U.S. Patent Documents

Reissue of:

[64] Patent No.: 3,815,013
Issued: June 4, 1974
Appl. No.: 365,429
Filed: May 31, 1973

U.S. Applications:

[63] Continuation of Ser. No. 262,643, June 14, 1972, abandoned.

[52] U.S. Cl. ..... 323/6; 323/44 R; 323/88; 324/123 C; 324/127

[51] Int. Cl.[2] ..... G01R 19/00

[58] Field of Search ..... 323/1, 6, 8, 50, 44, 323/84–88, 108–110, 120; 324/110, 123, 127; 330/106, 124 R; 328/155; 317/16; 321/45 C, 47

[56] References Cited

UNITED STATES PATENTS

| | | | |
|---|---|---|---|
| 2,981,888 | 4/1961 | White, Jr. | 324/110 X |
| 3,199,043 | 8/1965 | Hinrichs | 330/124 R |
| 3,524,135 | 8/1970 | Nercessian | 324/123 |
| 3,617,878 | 11/1971 | Senour | 324/123 X |
| 3,714,545 | 1/1973 | Chiffert | 323/6 |
| 3,733,538 | 5/1973 | Kernick et al. | 321/45 C |

OTHER PUBLICATIONS

Basic Electrical Measurements, by M. B. Stout; Prentice-Hall, Inc., 1961; 2nd Printing, pp. 397–413.

Kepco Power Supply Handbook – P. Birman; 1966; Cat. No. TK 451 k4B5 (Sci. Lib. of PTO), pp. 31–39.

*Primary Examiner*—Gerald Goldberg
*Attorney, Agent, or Firm*—Vale P. Myles

[57] ABSTRACT

A current transformer and transresistance amplifier are combined; the secondary winding of the current transformer being connected to the input of the transresistance amplifier and being virtually short-circuited because of the very low input impedance of the transresistance amplifier. The transresistance amplifier, nevertheless, supplies an output voltage which is proportional to current in the primary winding of the current transformer. An output voltage is developed from the current in the secondary winding. An important advantage, among others, of the subject combination is that a current transformer having considerably lower volt-ampere capacity may be employed. A current transformer employed alone for the same purpose would have to have a much larger volt-ampere capacity.

12 Claims, 9 Drawing Figures

Fig. 1
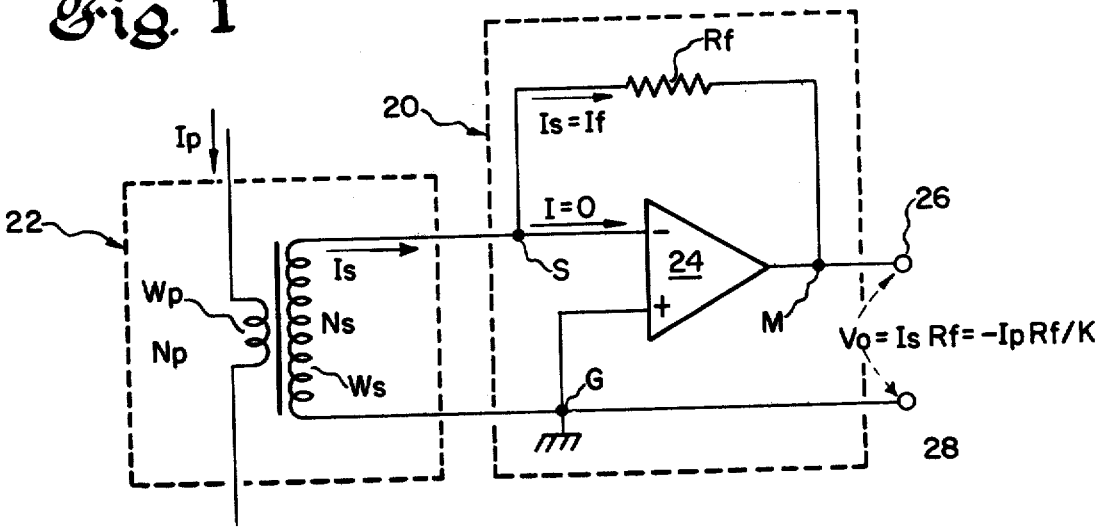
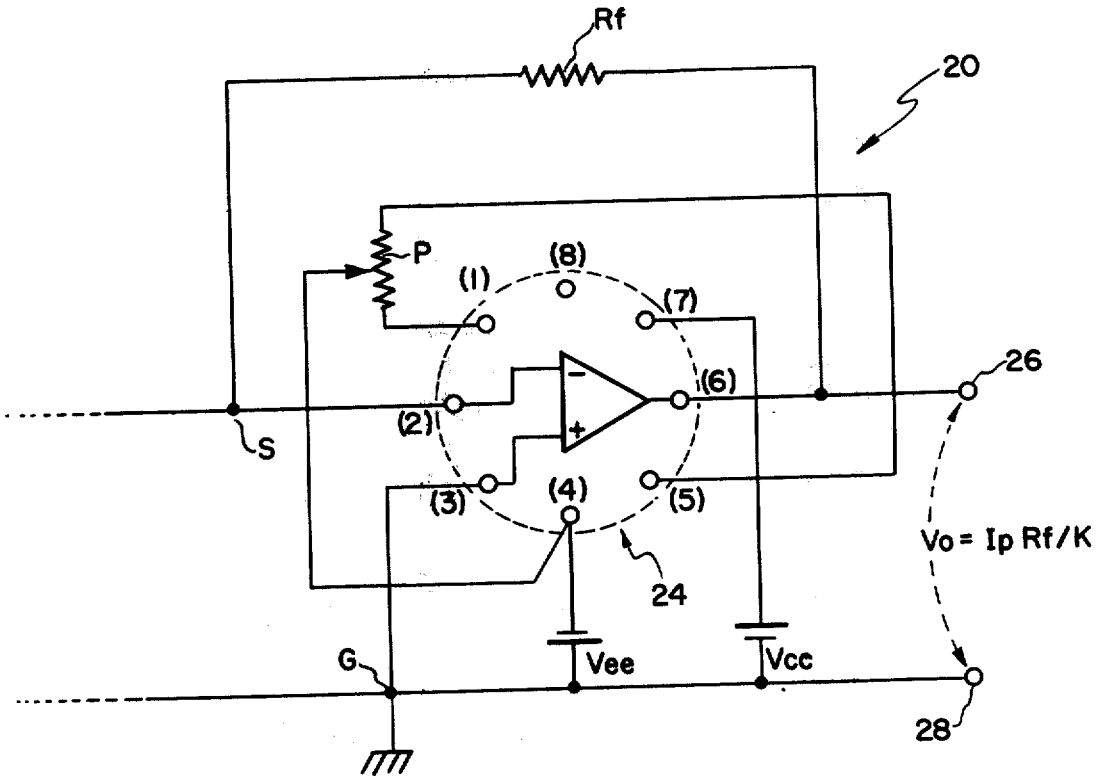
Fig. 2

CURRENT TRANSFORMER WITH ACTIVE LOAD TERMINATION

Matter enclosed in heavy brackets [ ] appears in the original patent but forms no part of this reissue specification; matter printed in italics indicates the additions made by reissue.

This is a continuation of application Ser. No. 262,643, filed June 14, 1972, now abandoned.

BACKGROUND OF THE INVENTION

The subject invention pertains, in general, to improvements in instrument transformer performance; and, more particularly, to the combination of a transresistance amplifier with a current transformer for the purpose of terminating the current transformer with an active load element which virtually short-circuits the transformer while providing an output voltage which is proportional to the transformer current of interest.

Ideally, an instrument current transformer should operate with its secondary short-circuited. However, this would mean that the voltage across the secondary would be zero and it would not, ordinarily, be possible for the secondary to supply an output voltage proportional to current in the primary; the voltage output being required for metering purposes, for example.

SUMMARY OF THE INVENTION

One object of the invention is to enable an instrument current transformer to be operated with an apparent, or virtual, short-circuited secondary while an output voltage, developed in response to its finite secondary current, is supplied; said output voltage being proportional to the current in the primary winding of the current transformer.

Another object of the invention is to effect a substantial reduction in required volt-ampere capacities of instrument transformers.

Briefly, according to the invention, the current-carrying secondary of a transformer is terminated by an active load element, such as a transresistance amplifier, which virtually short-circuits the transformer secondary because of the very low input impedance of the active load element. Paradoxically, although the secondary is virtually short-circuited its finite secondary current is employed by the active load element for developing an output voltage which is proportional to current in the transformer primary.

One feature of the invention resides in the employment of a transresistance amplifier for terminating the secondary of an instrument current transformer.

Another feature of the invention resides in the employment of phase-shifting means, such as an inverting operational amplifier or the equivalent, in conjunction with a transresistance amplifier so that at least pairs of output voltages, proportional to primary current, may be developed; the output voltages being phase-shifted with respect to each other.

Other objects as well as the various features and advantages of the invention are set forth hereinafter where specific illustrative embodiments of the invention are described in detail with reference to the accompanying drawings.

THE DRAWINGS

FIG. 1 is a schematic illustration of the invention showing an instrument current transformer terminated with a transresistance amplifier.

FIG. 2 is a schematic illustration showing in more detail the transresistance amplifier shown in FIG. 1.

Figure 9:
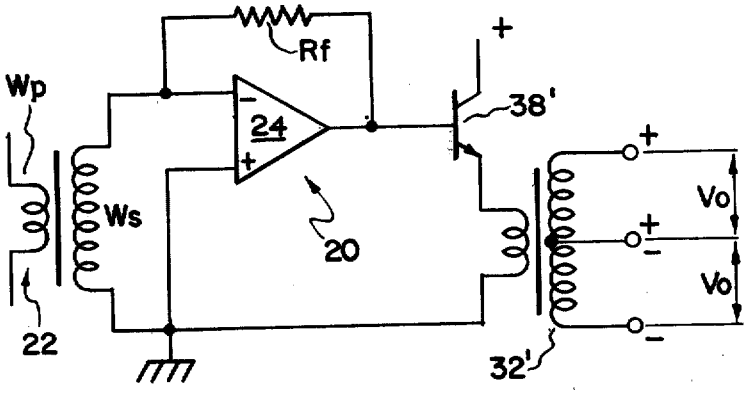

FIG. 9 is a schematic illustration showing an additional transistor 38' and output coupling transformer 32' coupled to the output of the transresistance amplifier for providing a pair of output voltages which are 180° out of phase.

DESCRIPTION OF PREFERRED EMBODIMENTS

One illustrative embodiment of the invention is shown in the schematic diagram at FIG. 1 whereat a transresistance amplifier designated, generally, by the reference number 20 is coupled with the output of an instrument current transformer which is designated, generally, by the reference number 22. Generally, the transresistance amplifier 20 is an amplifier which provides an output voltage proportional to input current. In accordance with the invention the transresistance amplifier 20 serves as an active load for the current transformer 22. The transresistance amplifier 20 presents a very low input impedance to the output of the current transformer 22 so that the secondary of the current transformer 22 is virtually short circuited. Thus, the current transformer 22 operates under ideal conditions (short circuit) while the transresistance amplifier 22 develops a proportional voltage signal which may be used for metering purposes, among others.

As shown in FIG. 1 the current transformer 22 includes a primary winding Wp having Np turns and a secondary winding Ws of Ns turns; both windings being magnetically coupled with a core of suitable magnetic material. As indicated, the primary winding Wp is in series with a conductor carrying a current Ip. The secondary winding Ws carries a current Is. For the current transformer 22 the relationships among Ip, Is, Np and Ns are as follows:

$$K = Ns/Np \quad \text{(equation 1)}$$

$$Is = Ip/K \quad \text{(equation 2)}$$

The transresistance amplifier 20 is comprised of an operational amplifier 24. In FIG. 1 the operational amplifier 24 is provided with two input terminals which are designated with − and + signs. The − terminal is an inverting input terminal and the + terminal is a non-inverting input terminal. In addition, the operational amplifier 24 is provided with an output terminal 26. Also, as shown in FIG. 1, a feedback resistor Rf is connected in parallel with the operational amplifier 24 between a summing point S and a junction point M. The junction point M is located at a common potential with the output terminal 26 and the summing point S is at the same potential as the inverting input terminal (−) of the operational amplifier 24. Also, as shown in FIG. 1 the non-inverting input terminal (+) of the operational amplifier 24 is connected to junction point G which is at the same potential as another output terminal 28 of the transresistance amplifier 20.

The transresistance amplifier 20 is illustrated in more specific detail in FIG. 2. In the illustrative example in FIG. 2 operational amplifier 24 is identified as the high performance operational amplifier μA741 manufactured by Fairchild Semiconductor, a division of Fairchild Camera and Instrument Corporation, 313 Fairchild Drive, Mountain View, California. The Fairchild operational amplifier μA741 is an integrated circuit device and a connection diagram (top view) therefor is shown in FIG. 2. The numbers shown in parenthesis such as (1), (2), . . . (8) identify the actual pin connections on the Fairchild μA741 operational amplifier; i.e., the operational amplifier also identified herein by the reference number 24 in FIGS. 1, 2 and elsewhere. As indicated in FIG. 2, a DC voltage source (15 volts) Vee is connected between the pin (4) and a junction point which is at a common potential with the junction point G. Also, as indicated in FIG. 2 another DC voltage source (15 volts) Vcc is connected between the pin (7) and a reference junction point common to the junction point G. The voltage sources Vee and Vcc are connected to the pins (4) and (7) such that pin (4) is at −15 volts and the pin (7) is at +15 volts. Also as indicated in FIG. 2, a potentiometer P is connected between the pins (1) and (5). The potentiometer P includes a voltage selecting slider which is connected to the pin (4) which is at a potential of −15 volts. The potentiometer P has a rating of 10K ohms. The slider on the potentiometer P is adjustable for the purpose of providing appropriate offset nulling voltages for the operational amplifier 24.

Figure 3:
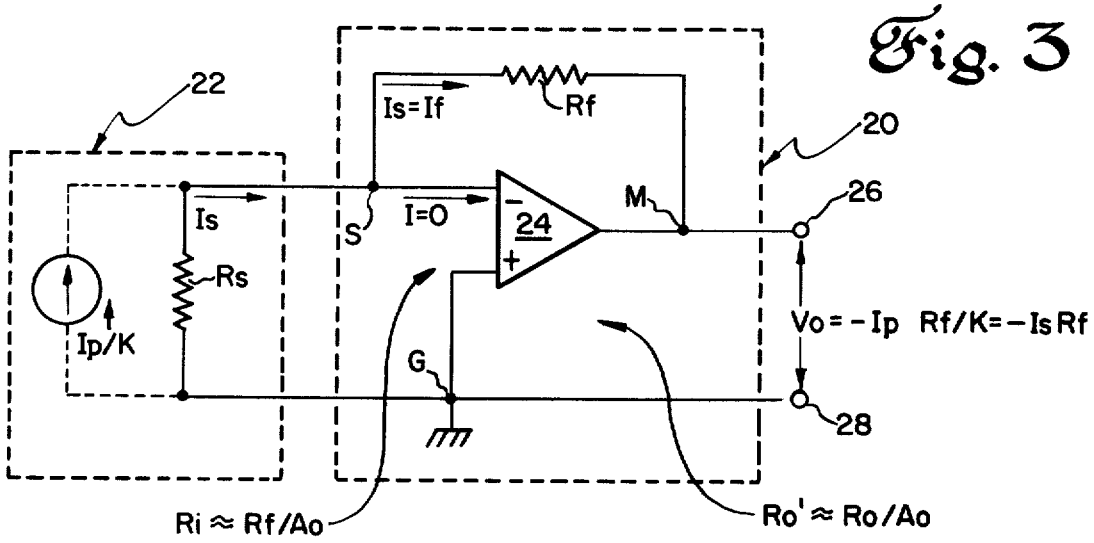
FIG. 3 is a schematic illustration, similar to the one shown in FIG. 1, except that the current transformer has been replaced by an ideal current source.

The operating principal involved is discussed hereinafter with reference to FIGS. 1 and 3. In FIG. 3, for purposes of analysis, the current transformer 22 of FIG. is replaced by an ideal current source which, as indicated, provides a current Is = Ip/K (equation 2) and a resistance Rs connected across the ideal current source. The resistance Rs represents the AC output impedance of the current transformer 22. The operational amplifier 24 has an open loop gain Ao, greater than $10^4$. The transresistance amplifier 20 has a very low input resistance Ri and it may be expressed by the following approximation:

$$Ri \approx Rf/Ao \quad \text{(equation 3)}$$

In more general terms, the transresistance amplifier 20 has a very low input impedance Zi which may be expressed by the following approximation:

$$Zi \approx Zf/Ao \quad \text{(equation 3a)}$$

where Zf represents a feedback impedance connected between points S and M.

In particular example shown FIGS. 1 and 3 the input resistance Ri is less than 0.5 ohm. This represents a virtual short circuit across the secondary winding Ws of the current transformer 22. As a result, the summing point S is virtually at ground potential. In other words, the summing point S is at substantially the same potential as the junction point G; the voltage between the points S and G being substantially zero. In effect, the secondary winding Ws of the current transformer 22 "sees" a short circuit across summing point S and junction point G. Thus, the summing point S conducts no current to junction point G (ground). Instead the current Is from the secondary winding Ws leaves the summing point S and passes through the feedback resistor Rf. Thus, there appears at the junction M and the output terminal 26 the output voltage Vo which is defined as:

$$Vo = -Is\ Rf \quad \text{(equation 4)}$$

Using equation 2 and substituting:

$$Vo = -Ip\ RF/K \quad \text{(equation 5)}$$

The negative sign (−) appears in equations 4 and 5 because Vo is inverted 180° in phase with respect to Is and If. This phase inversion is illustrated clearly in the waveforms shown in FIGS. 4 and 5. As indicated in FIGS. 1 and 3 substantially all of the current Is from the secondary winging Ws enters the summing point S and exits therefrom to pass as the current designated If through the feedback resistance Rf so that:

$$If = Is \quad \text{(equation 6)}$$

Therefore, equation 4 may be rewritten as:

$$Vo = -Is\ Rf = -If\ Rf \quad \text{(equation 4a)}$$

In addition, the output resistance Ro′ of the amplifier may be expressed as $$Ro' \approx Ro/Ao \quad \text{(equation 7)}$$

where Ro is the open-loop output resistance (approximately 100 ohms) of amplifier 24; i.e., the output resistance measured where Rf is disconnected. Equation 7 can be stated in broader terms as $$zo' \approx Zo/Ao \quad \text{(equation 7a)}$$

where Zo is the open-loop output impedance, corresponding to Ro, and Zo′ is the output impedance, corresponding to Ro′.

The following example will serve to illustrate some important aspects of the subject invention: where Rf = 2000 ohms and If = Is = 5 milliamperes, Vo = 10 volts according to equation 4a. By coupling the secondary winding Ws of the current transformer 22 to the input of the transresistance amplifier 20, as indicated in FIGS. 1, 2 and 3, it is possible to greatly reduce the size and the cost of the current transformer. This considerable reduction occurs because of a considerable reduction in the volt-ampere rating of the transformer. If, for example, the transresistance amplifier 20 was not employed, the secondary winding Ws of the current transformer 22 would have to carry a current Is = 1 ampere to produce an output voltage Vo = 10 volts across a 10 ohm load resistance connected across the secondary winding Ws. However, by using the transresistance amplifier 20 the volt-ampere product of current transformer 22 is about 10,000 times smaller than the volt-ampere product of the current transformer if used alone, without the transresistance amplifier 20. Because the current transformer 22 is virtually short-circuited the power transformed to its secondary is reduced. Since the transformer 22 operates under a virtual short circuit the only power required is that power needed to sustain the copper and iron losses.

Figure 4:
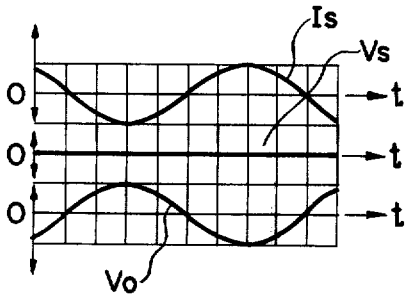
FIG. 4 is a reproduction of oscillograms showing the various amplitudes and phase relationships among secondary current Is, voltage Vs at the input to the transresistance amplifier, and the output voltage Vo of the transresistance amplifier.
Figure 5:
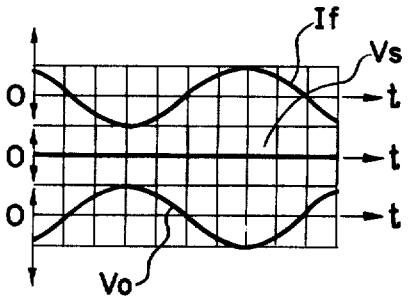
FIG. 5 is a reproduction of an oscillogram showing amplitude and phase relationships among current If in a feedback resistance Rf, a voltage Vs at the input of the transresistance amplifier, and an output voltage Vo supplied by the transresistance amplifier.
Figure 6:
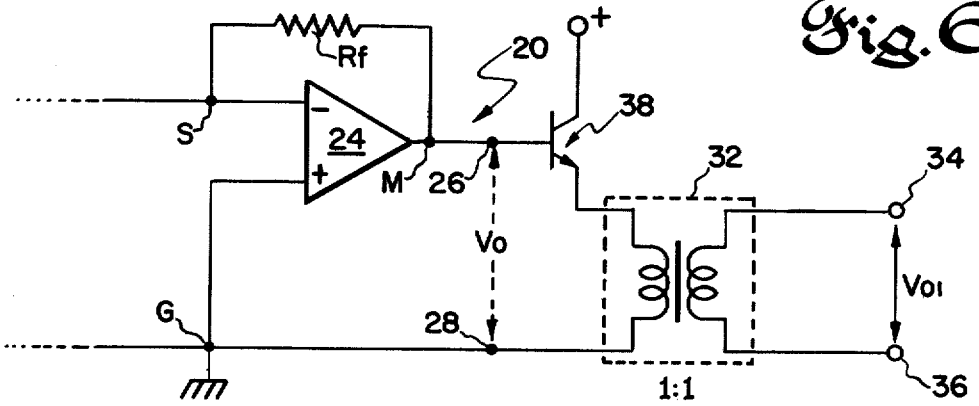
FIG. 6 is another schematic illustration showing a transistor and additional output coupling transformer for supplying an output voltage Vol which is free of any DC component.

In FIGS. 4 and 5 time-varying waveforms (oscillograms) of Is, If, Vs and Vo are illustrated; Vs being the voltage measured at the summing point S. For Rf = 2000 ohms, the waveforms, or oscillograms, at FIGS. 4 and 5 show that the feedback current If and the secondary current Is in the secondary winding Ws of the current transformer 22 was measured at 5 milliamperes. The voltage Vs is practically zero, (less 1 millivolt) indicating virtual short circuit condition. The output voltage Vo was measured to be 10 volts (peak). As shown, the output voltage Vo is symmetrical with the zero-line in FIGS. 4 and 5; i.e., Vo does not contain any significant DC component. At Vo = 10 volts, for example, a 0.1 millivolt DC offset voltage will produce an error of only 0.001 percent. However, with the Fairchild $\mu$A741 amplifier, offset voltage compensation capability is provided. Another way of obtaining an output voltage Vol, free from any DC component, is shown at FIG. 6 where a transistor 38 and output coupling transformers 32 having a 1:1 turns ratio is provided.

Figure 7:
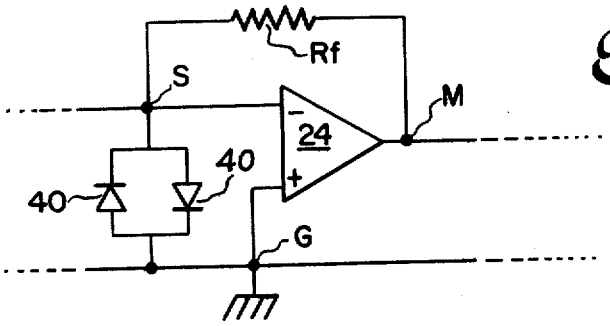
FIG. 7 is a schematic illustration of the transresistance amplifier including transient voltage protection means; said means also protecting the current transformer against becoming open circuited and, in addition, the diodes 40, 40 maintain a summing point S at ±0.7 volt in the event that amplifier 24 is overdriven.

Illustrated at FIG. 7 is a way of protecting the amplifier 24 from transient over voltages by connecting a pair of oppositely poled Si diodes 40 in parallel with the input to the amplifier. By this arrangement the voltage between the points, or nodes, S and G cannot exceed ±10.7 volt, for example. The oppositely poled Si diodes also serve as protection for the operational amplifier 24 if it is overdriven. In this case, the summing point S is no longer at virtually zero potential. In addition, the diodes serve as protection for the current transformer if the operational amplifier is accidentally disconnected.

Figure 8:
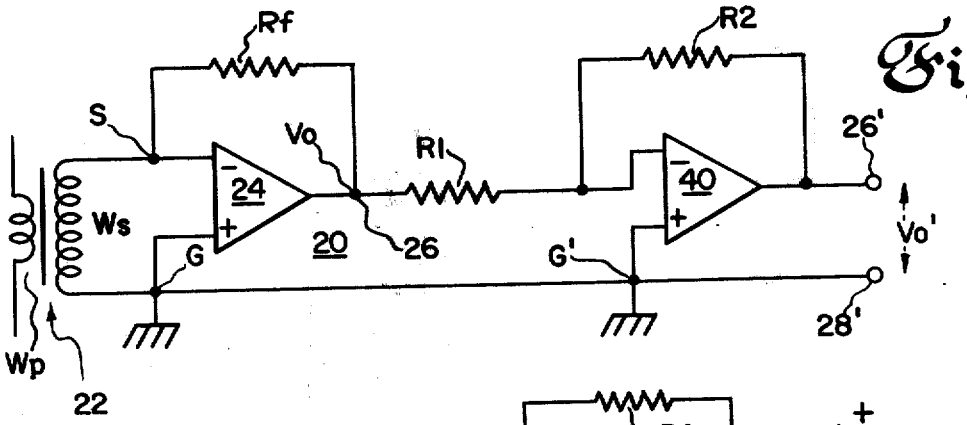
FIG. 8 is another schematic illustration showing an inverting operational amplifier coupled to the output of the transresistance amplifier of FIG. 1; the arrangement being useful for supplying a pair of output voltages which are 180° out of phase with each other.

In certain applications it may be necessary, or desirable, to provide multiple output voltage signals, like the output voltages Vo and Vol which are shifted in phase by 180°. FIGS. 8 and 9 show two different ways of accomplishing this.

Another method of obtaining a phase-inverted output voltage Vo′ is illustrated in FIG. 8 where an inverting operational amplifier 40 is resistance-coupled by means of a resistor R1 to the output of the transresistance amplifier 20. Thus, between the output terminals 26′ and 28′ there appears the output voltage Vo′ which is inverted 180° with respect to the output voltage Vo which appears between the output terminal 26 and the junction point G or 28′ of the transresistance amplifier 20.

Still another method of obtaining a 180° phase shift is shown in FIG. 9 where a transformer 32′ and transistor 38′ are employed. The circuit shown in FIG. 9 is similar to that shown in FIG. 6, except that the transformer 32′ has a center-tapped secondary winding where two voltage output signals Vo and Vo′ are supplied. The voltage output signals Vo and Vo′ are 180° out of phase.

While specific embodiments of the invention have been illustrated and described in detail to illustrate the invention, it is to be understood that the invention may be otherwise embodied without departing from the spirit and scope of the invention which is hereinafter set forth in the claims.

What is claimed is:

1. In combination: a current transformer including primary and secondary windings adapted for conducting primary and secondary currents, respectively; and, a transresistance amplifier for terminating said secondary winding and serving as an active load which virtually short-circuits said secondary winding while supplying an output voltage proportional to the primary current, if any[.] *and, means coupled with said transresistance amplifier for supplying in response to said output voltage another output voltage phase-inverted with respect to said output voltage.*

[ 2. The combination according to claim 1 further comprising means coupled with said transresistance amplifier for supplying in response to said output voltage another output voltage phase-inverted with respect to said output voltage. ]

3. In combination: a current transformer comprising primary and secondary windings adapted for conducting primary and secondary currents, respectively; and an operational amplifier including first and second input terminal means, output terminal means, and a feedback resistance connected between said first input terminal means and said output terminal means, said operational amplifier having a high open-loop gain and a low input resistance, measurable between said first and second input terminal means, said secondary winding being connected between said first and second input terminal means and in parallel with said low input resistance whereby there is no substantial potential difference between said first and second input terminals even when said secondary winding conducts secondary current, said operational amplifier supplying, between said output terminal means and said second input terminal means, an output voltage proportional to said primary current.

4. The combination according to claim 3 wherein said input resistance of said operational amplifier is defined as:

$$Ri \approx Rf/Ao$$

where Ri is the input resistance, Rf is the magnitude of said feedback resistance, and Ao is the open-loop gain of said operational amplifier.

5. The combination according to claim 4 wherein Ri is not greater than 0.5 ohm.

6. The combination according to claim 3 wherein said output voltage is defined as:

$$Vo = -Is\ Rf = -Ip\ Rf/K$$

where Vo is the magnitude of the output voltage, Is is the magnitude of the secondary current, Rf is the magnitude of the feedback resistance, Ip is the magnitude of the primary current, and K = Ns/Np, and Ns and Np are the number of turns on the secondary and primary windings, respectively.

7. The combination according to claim 3 wherein said output voltage is a varying voltage which may include a DC component and said combination according to claim 3 is further comprised of means connected between said output terminal means and said second terminal means for translating said output voltage without said DC component.

8. The combination according to claim 3 further comprising inverting operational amplifier means, responsive to said output voltage, for supplying another output voltage which is phase-inverted 180° with respect to said output voltage.

9. In combination: a transformer including at least one secondary winding adapted for conducting secondary current; and, operational amplifier means serving as an active load for terminating said secondary winding in a virtual short circuit while supplying an output voltage proportional to said secondary current, if any [.] , *said operational amplifier means including input and output terminal means and a feedback resistance connected between said input and output terminal means, said output voltage being defined as:*

$$Vo = Is\ Rf$$

*where Vo is the output voltage, Is is the secondary current, and Rf is the feedback resistance.*

[ 10. The combination according to claim 9, wherein said operational amplifier means includes input and output terminal means and a feedback resistance connected between said input and output terminal means, said output voltage being defined as:

$$Vo = -Is\ Rf$$

where Vo is the output voltage, Is is the seconday current, and Rf is the feedback resistance. ]

11. The combination according to claim 9 wherein said output voltage is a varying voltage which may include a DC component and said combination according to claim 9 is further comprised of means coupled with said operational amplifier means for translating said output voltage without its DC component.

12. In combination: a current transformer including primary and secondary windings; a high gain amplifier including first and second input terminals between which said secondary winding is connected so that said amplifier represents a very low impedance connected across said secondary winding, said amplifier including an output terminal; and, a feedback impedance connected between said first input terminal and said output terminal.

13. The combination according to claim 12 wherein the primary and secondary windings are adapted for conducting primary and secondary currents, respectively, and the very low impedance of said amplifier virtually short-circuits said secondary windings so that no substantial difference of potential exists between said first and second input terminals while substantially all of the secondary current is conducted from said first input terminal through said feedback impedance to said output terminal so that between said output terminal and said second input terminal there exists a potential difference substantially equal to the product of the secondary current and the feedback impedance.

14. The combination according to claim 13 wherein said potential difference between said output terminal and said second input terminal is a varying potential difference which may include DC component and said combination according to claim 13 is further comprised of means connected between said output terminal and said second input terminal for translating said varying potential difference without its DC component.

[ 15. A current transformer including a current carrying primary and a current-carrying secondary, and a transresistance amplifier terminating said secondary in a virtual short circuit while said amplifier in response to the secondary current, supplies an output voltage proportional to primary current. ]

* * * * *